US009345145B2

(12) United States Patent
Iwai et al.

(10) Patent No.: US 9,345,145 B2
(45) Date of Patent: May 17, 2016

(54) ELECTROLESS GOLD PLATING SOLUTION FOR FORMING FINE GOLD STRUCTURE, METHOD OF FORMING FINE GOLD STRUCTURE USING SAME, AND FINE GOLD STRUCTURE FORMED USING SAME

(75) Inventors: Ryota Iwai, Soka (JP); Tomoaki Tokuhisa, Soka (JP); Masaru Kato, Soka (JP); Tokihiko Yokoshima, Tsukuba (JP); Masahiro Aoyagi, Tsukuba (JP); Yasuhiro Yamaji, Tsukuba (JP); Katsuya Kikuchi, Tsukuba (JP); Hiroshi Nakagawa, Tsukuba (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 899 days.

(21) Appl. No.: 13/255,392

(22) PCT Filed: Mar. 10, 2010

(86) PCT No.: PCT/JP2010/054012
§ 371 (c)(1),
(2), (4) Date: Nov. 21, 2011

(87) PCT Pub. No.: WO2010/104116
PCT Pub. Date: Sep. 16, 2010

(65) Prior Publication Data
US 2012/0119352 A1  May 17, 2012

(30) Foreign Application Priority Data
Mar. 10, 2009  (JP) ................................. 2009-057030

(51) Int. Cl.
*H01L 23/48*  (2006.01)
*H05K 3/18*  (2006.01)
(Continued)

(52) U.S. Cl.
CPC ............ *H05K 3/187* (2013.01); *C23C 18/1605* (2013.01); *C23C 18/1607* (2013.01);
(Continued)

(58) Field of Classification Search
CPC ............ C23C 18/1633; C23C 18/1607; C23C 18/1605; C23C 18/1844; C23C 18/1834; C23C 18/1851; H05K 3/187
USPC ............. 257/734, E21.575, E23.01; 438/674; 106/1.18
See application file for complete search history.

(56) References Cited

U.S. PATENT DOCUMENTS 5,258,062 A    11/1993  Nakazawa et al.
5,803,957 A *   9/1998  Murakami et al. ........... 106/1.13
(Continued)

FOREIGN PATENT DOCUMENTS

JP    3-215678 A    9/1991
JP    4-350172 A    12/1992
(Continued)

OTHER PUBLICATIONS

[No Author Listed] Crystallinity Change by UPD, Plating Technology Handbook, Chapter 4. pp. 273-282.
(Continued)

*Primary Examiner* — Kenneth Parker
*Assistant Examiner* — Bo Fan
(74) *Attorney, Agent, or Firm* — Wolf, Greenfield & Sacks, P.C.

(57) ABSTRACT

An electroless gold plating solution with which one or more openings formed in a resist overlying a substrate can be filled in a short time, the openings having a width on the order of micrometer, in particular, 100 μm or smaller, in terms of the width of the exposed substrate area, and having a height of 3 μm or larger. The electroless gold plating solution contains a deposition accelerator for deposition in fine areas, and a microfine pattern of 100 μm or finer is formed therefrom.

13 Claims, 1 Drawing Sheet

(51) Int. Cl.
*C23C 18/16* (2006.01)
*C23C 18/44* (2006.01)
*C23C 18/18* (2006.01)

(52) U.S. Cl.
CPC ............... *C23C18/44* (2013.01); *C23C 18/165* (2013.01); *C23C 18/1834* (2013.01); *C23C 18/1844* (2013.01); *C23C 18/1851* (2013.01)

(56) References Cited

U.S. PATENT DOCUMENTS

| | | | |
|---|---|---|---|
| 7,534,289 B1* | 5/2009 | Yomogida | 106/1.23 |
| 2002/0112218 A1 | 8/2002 | Nakamura et al. | |
| 2004/0118317 A1* | 6/2004 | Iwai et al. | 106/1.23 |
| 2007/0175358 A1* | 8/2007 | Hwang | C23C 18/44 106/1.22 |
| 2007/0175359 A1* | 8/2007 | Hwang | C23C 18/44 106/1.23 |
| 2009/0114431 A1* | 5/2009 | Kuroda et al. | 174/257 |

FOREIGN PATENT DOCUMENTS

| | | |
|---|---|---|
| JP | 6-145997 A | 5/1994 |
| JP | 6-280039 A | 10/1994 |
| JP | 8-239768 A | 9/1996 |
| JP | 09-157859 | 6/1997 |
| JP | 2000-340594 A | 12/2000 |
| JP | 2000-340595 A | 12/2000 |
| JP | 2003-179094 A | 6/2003 |
| JP | 2003-218061 A | 7/2003 |
| JP | 2004-190075 A | 7/2004 |
| JP | 2004-250765 A | 9/2004 |
| JP | 2005-336600 A | 12/2005 |
| JP | 2006-291242 A | 10/2006 |
| JP | 2008-208392 A | 9/2008 |

OTHER PUBLICATIONS

[No Author Listed] Surface Treatment Technology Handbook, Chapter 2. pp. 337, 339-340, 452-454.
Aramaki. Structures of self-assembled monolayers and protection of metals against corrosion. 1996;47(12):1002-7.
Ejiri et al., 21st Collection of Papers of Japan Institute of Electronics Packaging. 2007; pp. 201-202.
Kaneko et al., Sn-Cu solder bump formation from acid sulfate baths using electroplating method. Electrochem. Jun. 19, 2003;71(9):791-4.
Kondo et al., 118th Proceedings of the Association of Surface Technology. 2008; pp. 308-311.
Mori et al Electronics Mounting Technology. 2007; 23 (12):48-51.
Osaka et al., Mechanism of sulfur inclusion in soft gold electrodeposited from the thiosulfate-sulfite bath. J Electrochemic Soc. 2001;148(10):C659-62.
Osawa et al., In situ analysis of molecular structure of mercaptobenzothiazole adsorbed on silver and copper electrode surfaces. 1992;43(5):472-7.
Qiao, Non-Cyanide Electroless Gold Plating Process. Printed Circuit Information. 4:31-5.
Sasaki et al., In situ infrared reflection absorption spectroscopy of aromatic thiols absorbed on gold electrodes. Surface Technology. 1992;43(5):457-61.
English translation of the Chinese Office Action issued Nov. 27, 2012 for Chinese Application No. 201080011478.4.

* cited by examiner

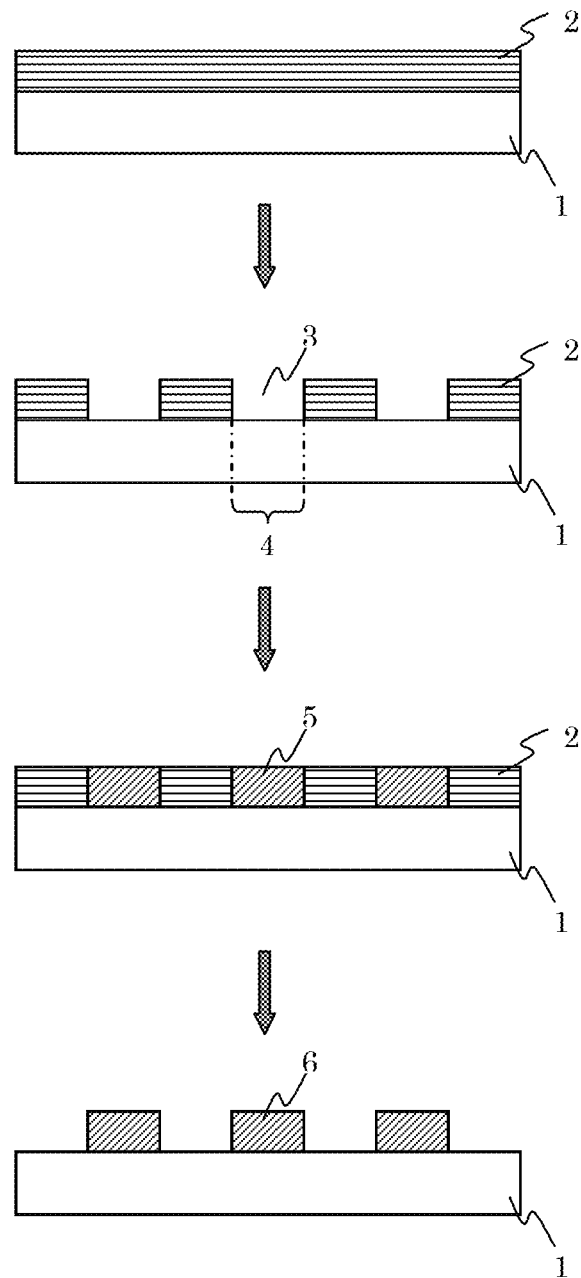

ELECTROLESS GOLD PLATING SOLUTION FOR FORMING FINE GOLD STRUCTURE, METHOD OF FORMING FINE GOLD STRUCTURE USING SAME, AND FINE GOLD STRUCTURE FORMED USING SAME

RELATED APPLICATION

This application is a national stage filing under 35 U.S.C. §371 of PCT International application PCT/JP2010/054012, filed Mar. 10, 2010.

TECHNICAL FIELD

The present invention relates to an electroless gold plating solution, a method for forming a microfine pattern using said electroless gold plating solution, and a microfine pattern fabricated by said formation method.

BACKGROUND ART

With miniaturization and densification of electronic devices, the use of flip-chip mounting technology via bumps has been active.

At present, the following methods are carried out: a method wherein bumps on a copper base are connected by soldering (Patent Literature 1, Non-patent Literature 1), a method wherein a palladium or gold thin film is formed on a copper and/or nickel base, and connected by adding solder (Patent Literature 2, Non-patent Literature 2), an electrolytic plating method (Patent Literatures 3 and 4), a dry method, an electroless plating method and others.

In the method wherein bumps on a copper base are connected by soldering, lead-free solders are actively used, leading to easy occurrence of problems in the reliability of connections. Furthermore, whiskers with a length of several μm to several hundreds μm are generated, frequently causing problems, and this is disadvantageous in reducing pitch size. In addition, electroless soldering has a problem in that thick soldering is difficult.

In the method wherein a palladium or gold thin film is formed on a copper and/or nickel base and connected by adding solder, while nickel having high hardness can be used as a mother material of bumps, its direct use in the connection of solid layers as in the case of gold is difficult, and it is not suitable for microsize with a width of 100 μm or less. In this method as well, soldering is used, and there is a problem of generation of whiskers.

In the case of a nickel mother material, a thin gold film is formed on said mother material, then fusion joining by soldering is carried out; in this case also, the above problems occur.

An electrolytic plating method is sometimes adopted as a method for producing bumps made of gold alone; however, this method has a problem in that it cannot form a film on a closed pattern.

In addition, when a plurality of microfine structures such as gold bumps are produced by an electrolytic plating method, structures with different heights tend to be generated, and as the pattern becomes finer, it becomes more difficult to form a plurality of bumps with a uniform height, i.e., a plurality of microfine structures with a uniform size.

For example, this problem of non-uniformity can be eliminated by smoothing of bumps using special polishing (chemical mechanical polishing (CMP)) after the plating process (Non-patent Literature 3). Cu is used in such processing, and its chemical dissolution is easy.

However, the Au structure of the present invention is chemically more stable than Cu, and therefore this method cannot be applied directly.

Technically, bumps made of gold alone can be produced by a dry method. When microfine structures such as gold bumps are produced using the dry method, there are problems such as that a large amount of the targeting material is consumed, and a long processing time is necessary; therefore they have not yet been practically adopted.

Meanwhile, in the case of an electroless plating method using electroless gold plating that does not accelerate deposition on fine sections, microfine structures with a desired height can be obtained by long-term processing or an increase in the deposition rate. However, since a resist is designed on the premise of patterning and removal, it is generally weak to high temperature and high-alkaline conditions; specifically, when a resist is immersed in an aqueous solution with a temperature of 60° C. or more for one hour or longer, cracking, swelling and elution of components tend to occur easily. In addition, even when the temperature is less than 60° C., the resist may sometimes be damaged by immersion for several hours.

Furthermore, when the gold deposition rate is increased regardless of the pattern size, bathes tend to show self-decomposition, so that practical application is difficult.

In the case of a cyanogen-containing electroless gold plating solution, conditions can be set such that a film-forming rate of 5 μm or more per hour is achieved even on a planar section, in addition to fine sections, while a self-decomposition reaction hardly occurs. However, cyanogen-containing high-speed electroless gold plating solutions comprise cyanogens that have an aggressive nature to various materials including metals, and also they are highly alkaline of pH 9 or more; thus damage to the resists can hardly be avoided.

Furthermore, gold plating used in the electroless plating method to date is of a substitution-reaction type wherein gold deposition of only less than 0.1 μm is possible, and even for thick plating, only up to 1 μm is possible, and the use of soldering is a premise.

Namely, with the conventional methods, microfine patterns with a size of micrometer order, in particular those with a width of 100 μm or less and a height of 3 μm or more can be hardly formed.

CITATION LIST

Patent Literature

Patent Literature 1: JP A 2000-340594
Patent Literature 2: JP A 2003-179094
Patent Literature 3: JP A 2006-291242
Patent Literature 4: JP A 2000-340595

Non-Patent Literature

Non-patent Literature 1: Norio Kaneko, Masako Seki, Susumu Arai, Naoyuki Shinohara: Electrochemistry, 71 (9) 791-794 (2003).

Non-patent Literature 2: Yoshinori Ejiri, Shuichi Hatakeyama, Shigeharu Ariie, Norihiro Nishida, Kiyoshi Hasegawa, Hiroshi Kawakami: 21$^{st}$ Collection of Papers of Japan Institute of Electronics Packaging, 201-202 (2007).

Non-patent Literature 3: Shun Mori, Kuniaki Tsurushima: Electronics Mounting Technology 23 (12), 48-51 (2007).

SUMMARY OF THE INVENTION

Problems to be Solved by the Invention

The present invention has been accomplished with consideration given to the above; the present invention aims to provide an electroless gold plating solution for fabricating a microfine pattern with a size of micrometer order, in particular that of 100 μm or less using gold alone, a method for forming a microfine pattern using said electroless gold plating solution, and a microfine pattern fabricated by said formation method.

Means of Solving the Problems

As a result of the present inventors' strenuous investigation, in the formation of microfine patterns by means of filling one or more openings in a micrometer order of size, in particular those with a width of exposed base area of 100 μm or less and a height of 3 μm or more, formed on a resist coating on a substrate, it has surprisingly been found that, by using an electroless gold plating solution comprising an accelerator for deposition in fine areas that has an action to suppress the reaction on a metal surface, and that has been conventionally known as an additive to suppress self-decomposition reaction of plating solution, namely, known as a stabilizer (Kunitsugu Aramaki: Surface Technology, 47 (12), 1002-1007 (1996)), the smaller the openings, the larger the deposition rate; after further research, the present invention has been accomplished.

Namely, the present invention relates to an electroless gold plating solution for forming a microfine pattern of 100 μm or less, comprising an accelerator for deposition in fine areas and a gold source.

In addition, the present invention relates to said electroless gold plating solution, wherein the concentration of the accelerator for deposition in fine areas is 0.001-10,000 mg/L.

Furthermore, the present invention relates to said electroless gold plating solution, wherein the accelerator for deposition in fine areas comprises one or more compounds selected from the group consisting of polymer compounds, nitrogen-containing compounds, and sulfur-containing water-soluble hydrocarbons.

In addition, the present invention relates to said electroless gold plating solution, wherein the accelerator for deposition in fine areas comprises one or more compounds selected from the group consisting of polyethylene glycol, 1,10-phenanthrolinium and 2-mercaptobenzothiazole.

Furthermore, the present invention relates to said electroless gold plating solution, further comprising a gold-deposition accelerator.

In addition, the present invention relates to said electroless gold plating solution, wherein the gold-deposition accelerator is a compound that generates halogen ions in an aqueous solution.

Furthermore, the present invention relates to said electroless gold plating solution, wherein the concentration of the gold-deposition accelerator is 0.001-3.0 mol/L.

In addition, the present invention relates to said electroless gold plating solution, further comprising a gold-deposition acceleration adjuvant, a complexing agent, a pH buffering agent, a pH adjuster, a reducing agent, and/or an additive.

Furthermore, the present invention relates to said electroless gold plating solution, which does not comprise a cyanide compound.

In addition, the present invention relates to a method for forming a microfine pattern by forming one or more openings in a resist coating on a substrate, and by filling said openings using the electroless gold plating solution according to any one of claims 1-9.

Furthermore, the present invention relates to said method, wherein the opening has a width of the exposed base area of 100 μm or less.

In addition, the present invention relates to said method, wherein the opening is an opening for forming a microfine pattern containing bumps and wiring patterns.

Furthermore, the present invention relates to said method, wherein a microfine pattern with a height of 3 μm or more is formed within 120 min.

In addition, the present invention relates to said method, wherein a microfine pattern is formed on a base that is a substrate whose entire surface is uniformly coated with a metal film and/or on a closed pattern without lead line.

Furthermore, the present invention relates to said method, wherein the metal film is a film of single layer or multiple layers formed from one or more of gold, nickel, copper, silver, aluminum, palladium, cobalt, titanium, tantalum, and tungsten, or from an alloy comprising them.

In addition, the present invention relates to said method, wherein the resist coating on the substrate is a positive type or a negative type.

Furthermore, the present invention relates to said method, wherein the temperature during electroless gold plating is 20-60° C.

In addition, the present invention relates to said method, wherein the electroless gold plating solution has pH 6-8.

Furthermore, the present invention relates to a microfine pattern fabricated using said method.

Advantageous Effects of the Invention

The electroless gold plating solution of the present invention enables, by comprising an accelerator for deposition in fine areas, to uniformly fill one or more openings in a micrometer order of size, in particular those with a width of exposed base area of 100 μm or less and a height of 3 μm or more, formed on a resist coating on a substrate; as a result, it enables to form a microfine pattern having a uniform height within a short period of time. Specifically, using the electroless gold plating solution of the present invention, a microfine pattern with a height of 3 μm or more can be formed within 120 min.

BRIEF DESCRIPTION OF THE DRAWINGS

FIG. 1 shows an embodiment of the invention in which openings 3 having an exposed area 4 (width of 100 μm or less) are formed in resist 2 coating on substrate 1. The resist-coated, substrate having openings 3 is immersed in electroless gold plating solution 5 and a gold source, thereby filling the openings with gold, to provide a microfine pattern 6 formed by gold deposition. The resist 2 is subsequently removed.

BEST EMBODIMENTS FOR CARRYING OUT THE INVENTION

Hereinafter, the present invention is described in further detail.

The electroless gold plating solution of the present invention is the one comprising an accelerator for deposition in fine areas and a gold source.

As the accelerator for deposition in fine areas, any substance that is used as adsorbent having an action to adsorb on a metal surface and to inhibit reactions may be used, including those used as a discoloration inhibitor which mainly aims at inhibition of oxidation reaction in the surface treatment of metals such as copper, aluminum, and alloys comprising them.

Conventionally, substances used as an adsorbent include, for example, 2-mercaptobenzothiazole used for improving stability of electroless gold plating, as well as similar sulfur-containing organic adsorbents disclosed in JP A 6-145997; however, the reaction-inhibition action by an adsorbent also inevitably inhibits deposition of metals in electroless plating. The above-mentioned 2-mercaptobenzothiazole and thiols are reported to have an action to adsorb on a metal surface (for example, Takeshi Sasaki, Tatsuo Ishikawa Surface Technology, 43 (5), 457-461 (1992) and Masatoshi Osawa, Naoki Matsuda, Isamu Uchida: Surface Technology 43 (5), 472-477 (1992)), and a decrease in the gold deposition rate due to excessive addition has also been reported (JP A 6-145997). Furthermore, with respect to polyethylene glycol, a decrease in gold deposition rate due to its excessive addition is also reported (JPA 2008-208392). Regarding all these adsorbents, an action to inhibit reaction on a substrate surface has been reported, and in electroless plating solutions, only an action to improve stability of the solution simultaneously with inhibiting the deposition of a metal has been reported; however, to date there has been no report on the action to accelerate deposition.

As the accelerator for deposition in fine areas used in the present invention, those exhibiting the above nature of the adsorbents are preferred. For microfine patterns, an action of supply acceleration by nonlinear supply of substances has been known (Kazuo Kondo: $118^{th}$ Proceedings of the Association of Surface Technology, 308-311 (2008)), and the accelerator for deposition in fine areas of the present application is considered to accelerate this action. Namely, the present accelerator adsorbs on the periphery of a microfine pattern or the pattern itself in an appropriate degree, and enhances the nonlinear supply, thereby exhibiting an action to accelerate the supply of a substance, in particular the supply of gold source, only at fine areas.

Specifically, the examples include water-soluble polymer compounds such as polyethylene glycol, polyvinyl alcohol and polyvinyl pyrrolidone, nitrogen-containing compounds such as benzotriazole, 1,10-phenanthrolinium and 2,2'-bipyridyl, sulfur-containing water-soluble hydrocarbons such as 2-mercaptobenzothiazole and 2-mercaptobenzoimidazole, as well as derivatives thereof. In addition, a component, which is used in plating solutions and which has a role to stabilize bathes can also be used as an accelerator for deposition in fine areas. These may be used alone, or in a combination of two or more types.

The accelerator for deposition in fine areas has an action to increase the ratio of the thickness of the gold deposition film on an opening of a micrometer order to the thickness of the gold deposition film on a planar section with a side length of 10 mm or more and a surface area of 100 mm$^2$ or more to be more than 1:1; in particular, an action to accelerate the deposition of gold in a specific concentration range at an opening having a width of the exposed base area of 100 µm or less.

Although the accelerator for deposition in fine areas even with a small quantity accelerates the deposition at fine areas, when the amount of addition is insufficient, there is a possibility that practical deposition rate cannot be achieved. Furthermore, when an excessive amount is added, the reaction is inhibited at fine areas.

The concentration of the accelerator for deposition in fine areas is preferably 0.001-10,000 mg/L, and more preferably 0.005-5,000 mg/L. For example, when polyethylene glycol with a mean molecular weight of 1,540-20,000 is used, the concentration is preferably 0.1-100 mg/L, and more preferably 0.5-30 mg/L. When 1,10-phenanthrolinium is used, the concentration is preferably 1-80 mg/L, and more preferably 5-30 mg/L. When 2-mercaptobenzothiazole is used, the concentration is preferably 0.1-5 mg/L, and more preferably 0.5-2 mg/L.

Examples of the gold source include water-soluble gold compounds containing no cyanogen, such as a gold complex salt of sulfurous acid, a gold complex salt of thiosulfuric acid, chloroauric acid, a thiourea gold complex salt, a gold complex salt of thiomalic acid, and a gold iodide salt, as well as hydrates thereof. These may be used alone, or in a combination of two or more types.

Regarding the gold source other than the thiourea gold complex salt, any salt form of alkaline metal, alkaline earth metal, and ammonium may be taken; regarding the thiourea gold complex salt, a salt form of perchloric acid or hydrochloric acid may be taken.

Specifically, examples of the gold complex salt of sulfurous acid include sodium gold sulfite such as $Na_3Au(SO_3)_2$ and potassium gold sulfite; examples of the gold complex of thiosulfuric acid include sodium thiosulfite such as $Na_3Au(S_2O_3)_2$ and potassium thiosulfite; examples of the salt of chloroauric acid include sodium tetrachloroaurate and potassium tetrachloroaurate, examples of the thiourea gold complex salt include thiourea gold hydrochloride and thiourea gold perchlorate, and examples of the gold complex salt of thiomalic acid include gold sodium thiomalate and gold potassium thiomalate.

The concentration of the gold source is, in terms of gold, preferably 0.001-0.5 mol/L, and more preferably 0.005-0.1 mol/L. For example, when sodium gold sulfite is used, its gold concentration is preferably 0.001-0.5 mol/L, and more preferably 0.005-0.1 mol/L.

The electroless gold plating solution of the present invention is used to form a microfine pattern by filling one or more openings of a micrometer order of size, with gold. Specifically, a metal film is sequentially formed on a substrate, and the substrate is further coated with a resist, then openings of a micrometer order of size produced on the resist are filled with gold, thus forming a microfine pattern.

As the substrate, in case of silicon wafer, standard products defined by JEITA or SEMI may be used.

As the metal film formed on the substrate, one or more kinds from gold, nickel, copper, silver, aluminum, palladium, cobalt, titanium, tantalum, tungsten, and an alloy that comprises them may be used, and the metal film may be a single layer or multiple layers. The thickness of the film is not particularly limited, but it is preferably in the range from 10 nm to 10 µm, because the object of the present invention is to form a very fine high-density microfine pattern. For example, a 20-µm film of titanium, then a 100-nm film of gold are formed. As a method for film formation, any of dry-type, electrolytic, and electroless methods may be used.

Upon film formation, the shape of a metal film viewed from the top may be entirely uniform, or a closed pattern without lead line.

Furthermore, this substrate onto which metal films have been formed is coated with a resist, and desired openings are formed on the resist. The resist coating onto the substrate is not particularly limited, and is either a positive type or a negative type. For example, when a positive-type photoresist is used, ultraviolet ray with a specific wavelength is irradiated at a desired section with a certain quantity or more, then the irradiated section is dissolved using a developing solution to form an opening.

The shape of openings may be any shape to form bumps and wiring patterns; when viewed from the top, wiring-pattern shape, circle, square shape and other shapes may be used. Openings have a width of the exposed base area of preferably 100 μm or less, and more preferably 50 μm or less, and the most preferably 30 μm or less. The lower limit value of the width of the exposed base area cannot be clearly defined, but considering the diameter of gold atoms, it is 0.3 nm or more, and in some cases it may be 1-100 nm when the crystal diameter must be regulated due to the physical properties of the gold structure required. The depth of the openings, i.e., the thickness of the resist is, from the viewpoint of patterning accuracy and exposure accuracy upon developing, preferably 5-20 μm.

Microfine patterns fabricated make an effect on causing non-linear supply of substances depending on their size (Kazuo Kondo: $118^{th}$ Proceedings of the Association of Surface Technology, 308-311 (2008)), and since this is an essential requirement for the acceleration of deposition at fine areas, the width of exposed base area and the depth of opening must be set within a specified range.

At an order of micrometer, the aspect ratio (the value of depth divided by diameter) is desirably 3 or less.

The cross-sectional shape of a metal deposit is regulated by the resist. For example, when a photoresist is used, the cross-sectional shape of this photoresist can be controlled up to a certain degree depending on the resist and exposure conditions. When the upper part of the opening is larger than the lower part (exposed base area), the cross-sectional shape is reverse-trapezoidal. When the upper part of the opening is smaller than the lower part, its cross-sectional shape is trapezoidal. In a trapezoidal shape, when the upper part is extremely smaller than the lower part, the shape becomes triangular; and a reverse-trapezoidal microfine structure becomes a circular cone when the opening is circular, and becomes a pyramid when the opening is polygonal. The 3-dimensional shape of a microfine pattern formed in the present invention may be any shape including: a structure formed perpendicularly from the base such as cube, hexahedron, circular cylinder, and rectangular cylinder, a structure whose shape viewed from the cross-sectional direction is trapezoid and triangle, such as circular cone and pyramid, or an upside-down structure thereof, i.e., a reverse trapezoid, and a structure of single or multiple staircase(s) pattern viewed from the cross-sectional direction. The same or different kinds of one or more of these microfine patterns are combined as a set and used as a part.

The electroless gold plating solution of the present invention may further comprise a gold-deposition accelerator.

As the gold-deposition accelerator, it is preferable to contain a component that has a strong action to accelerate anode reaction, and examples include a compound that generates halogen ions such as sodium chloride, potassium chloride, sodium iodide and potassium iodide, namely, an alkaline salt or alkaline earth salt of halogens. These may be used alone, or in a combination of two or more types.

Among the conventional electroless gold plating solutions, particularly in non-cyanogen electroless gold plating solutions using sulfurous acid, thiosulfuric acid, and thiocyanic acid, the reaction at the cathode side is a rate-limiting factor, namely, it governs the deposition rate.

A gold-deposition accelerator that accelerates anode reaction does not conventionally have a significant deposition-rate acceleration action for large areas having a maximum diameter of more than 1 mm, and it does not so accelerates the deposition at areas other than those wherein material supply required for cathode reaction is not always a rate-limiting factor, the areas such as pattern edges.

In contrast, when the above opening having the width of an exposed base area of 100 μm or less is to be plated using the electroless gold plating solution of the present invention, the material supply required for cathode reaction hardly becomes a rate-limiting factor due to nonlinear supply, and deposition of gold is accelerated even by the anodic gold-deposition accelerator.

That is, the present electroless gold plating solution accelerates the gold deposition reaction at fine areas compared to at large patterns, by further comprising a gold-deposition accelerator that accelerates anode reaction.

In addition to the above gold-deposition accelerators, a group of metals called "under potential deposition" metal (UPD metal) may also be added as a gold-deposition accelerator; specifically it includes a compound comprising thallium, lead, arsenic, antimony. However, since these gold-deposition accelerators accelerate the deposition of gold regardless of planar surface or fine area, sometimes the plating solution becomes extremely unstable. Furthermore, since these accelerators change the crystal grain size of the gold deposited (Crystallinity Change by UPD, Plating Technology Handbook, Chapter 4, Nikkan Kogyo Shimbun Ltd., and Surface Treatment Technology Handbook, Chapter 2, Sangyo Gijutu Service Center, Co., Ltd.), the hardness also tends to change easily, so that sometimes it cannot satisfy the characteristics required at bump junctions.

With the gold-deposition accelerator, when its amount of addition is insufficient, sometimes practical acceleration action of fine-area deposition cannot be obtained. In addition, when a large amount is added, an increase in the amount of impurities in a film and extreme miniaturization of crystal may occur, although no problem is found in the deposition rate.

The concentration of the gold-deposition accelerator is preferably 0.001-3.0 mol/L, and more preferably 0.005-2.0 mol/L. For example, when potassium iodide or sodium chloride is used, the concentration is preferably 0.001-3.0 mol/L, and more preferably 0.005-1.0 mol/L.

The electroless gold plating solution of the present invention may further comprise, if necessary, a gold-deposition acceleration adjuvant, a complexing agent, a pH buffering agent, a pH adjuster, a reducing agent, and an additive.

Examples of the gold-deposition acceleration adjuvant include amines, polycarboxylic acids, aminocarboxylic acids and aminophosphonic acids such as ethylenediaminetetraacetic acid and citric acid; in particular the component that accelerates anode reaction is preferred. For example, when disodium ethylenediaminetetraacetate dihydrate is used, its concentration is preferably 1-10,000 mg/L, and more preferably 10-5,000 mg/L.

Examples of the complexing agent include a compound that can form a complex with monovalent or trivalent gold ions, such as sulfurous acid and thiosulfuric acid, and sulfite and thiosulfate of alkaline metals such as sodium, potassium and of alkaline earth metals such as magnesium. These may be used alone, or in a combination of two or more types.

The concentration of the complexing agent is preferably 0.001-3.0 mol/L, more preferably 0.005-2.0 mol/L. For example, when potassium sulfite or sodium thiosulfate is used, its respective concentration range is preferably 0.05-2.0 mol/L and 1.0 mol/L or less, and more preferably 0.1-1.5 mol/L and 0.01-0.1 mol/L, and its preferable composition ratio is in the range of 1:0.01-0.8.

Furthermore, the concentration of the complexing agent depends on the concentration of gold. Specifically, its concentration relative to the gold concentration is, expressed in a molar ratio, for sulfurous acid and thiosulfuric acid, preferably 2-80 times and 0-50 times, respectively, and more preferably 5-30 times and 2-10 times, respectively.

The use of thiosulfuric acid with a concentration more than the above range can increase the deposition rate due to its reduction action, but simultaneously induces destabilization of bathes, and may inhibit deposition on fine areas.

Examples of the pH buffering agent include phosphate, tetraborate and borate of alkaline metals such as sodium and potassium, and of alkaline earth metals such as magnesium. These may be used alone, or in a combination of two or more types.

Specifically, examples include dipotassium hydrogen phosphate, disodium hydrogen phosphate, potassium dihydrogen phosphate, sodium dihydrogen phosphate, potassium tetraborate and sodium tetraborate.

The concentration of the pH buffering agent is preferably 0.001-2.0 mol/L, and more preferably 0.01-1.0 mol/L. For example, when dipotassium hydrogen phosphate is used, its concentration range is preferably 0.01-1.0 mol/L, and more preferably 0.02-0.5 mol/L.

When a pH buffering agent is used alone or used in combination, its buffering action differs depending on the pH used. Specifically, a phosphate buffer can be used for the pH range of 6-8. In contrast, at high pH and when pH value is not stable, borate or tetraborate buffer may be used in combination.

As the pH adjuster, an inorganic acid such as sulfuric acid, hydrochloric acid and phosphoric acid, a hydroxide salt such as sodium hydroxide and potassium hydroxide, as well as within a range that other components are not affected, ammonia such as $NR_4OH$ (R: hydrogen or alkyl) and amines such as tetramethylamine hydroxide can be used. These may be used alone, or in a combination of two or more types.

When phosphate buffer is used, the use of phosphoric acid or sulfuric acid as well as sodium hydroxide or potassium hydroxide is preferred as a pH adjuster.

The pH of the electroless gold plating solution used in the present invention is preferably 6-8.

As the reducing agent, general reducing agents having a catalyst activity to gold may be used. Examples include, ascorbate such as sodium L-ascorbate, etc., or hydroxylamine and hydroxylamine hydrochloride, salts of hydroxylamine such as hydroxylamine sulfate, etc., or hydroxylamine derivatives such as hydroxylamine-O-sulfonic acid, etc., or hydrazine, amine borane compounds such as dimethylamine borane, etc., boron hydride compounds such as sodium boron hydride, etc., sugars such as glucose, etc., and hypophosphites, thioureas such as thiourea, N-methylthiourea, and 1,3-dimethylthiourea, etc., and aromatic compounds containing a hydroxyl group such as hydroquinone and pyrogallol, etc.; these may be used alone, or in a combination of two or more types.

In addition, since sulfur-containing compounds such as thiourea also have an action as an accelerator for deposition in fine areas in addition to the action of reducing agent, they can also be used as the above accelerator for deposition in fine areas.

Other than the above, a compound which is judged from the Nernst's equation that it can reduce and deposit gold from gold ions or gold complexes may also be used, with consideration given to reactivity to other bath-constituent components and bath stability.

Since some of these reducing agents, such as hydrazine, possibly have a harmful action to human body, they must be selected upon usage considering objectives and environment of the use.

The amount of use of the reducing agent may be appropriately selected based on the kind of reducing agent, and the kind of base metal, etc. For example, when the base metal is gold and sodium L-ascorbate is used as the reducing agent, its concentration range is preferably 0.001-2.0 mol/L, and more preferably 0.01-1.0 mol/L. When thiourea and hydroquinone are used, their concentrations are preferably 0.0001-2.0 mol/L and 2.0 mol/L or less, respectively, and more preferably 0.0005-1.0 mol/L and 0.0001-1.0 mol/L, respectively.

When the amount of addition of the reducing agent is not sufficient, the deposition rate of gold becomes extremely low, so that practical rate cannot be obtained. In addition, when a large amount is added, bathes may become unstable.

For the electroless gold plating solution of the present invention, as other additives, a crystal grain shape adjuster and a gloss agent in an appropriate concentration range may be used as additives. For example, conventionally-used agents may be used without limitation; specifically, thallium, copper, antimony and lead are used. Moreover, other substances that satisfy the above conditions may be used. However, some of these could change the hardness, resulting in the loss of functions required for a structure; therefore, special care is required for the use of such substances.

The electroless plating solution of the present invention preferably does not contain cyanide compounds.

The temperature of use of the electroless gold plating solution in the present invention is 20-60° C., and more preferably 30-55° C. Under a high-temperature condition of 60° C. or over, since resists tend to be damaged easily, it becomes necessary to reduce the processing time; in this case, sometimes a structure with sufficient height cannot be obtained. Furthermore, under a low-temperature condition of below 40° C., the gold deposition rate becomes low, but damage to the resist is small and long-term processing becomes possible. However, extending the processing time is not preferred from the industrial aspect, i.e., decreasing the productivity.

EXAMPLES

Hereinafter, the electroless gold plating solution of the present invention is described in detail using examples and comparative examples; however, the present invention is not limited to these examples.

In the following examples, methods and conditions of each processing, analysis and measurement are as follows.

As the plating base, 3-inch Si wafer/Ti 20 nm/Au 100 nm/PR 10 μm (PR: positive photoresist PMER P-LA900PM, manufactured by Tokyo Ohka Kogyo Co., Ltd.) (representing lower layer/upper layer, hereinafter) was used and openings with ϕ 5-10 μm and 20-30 μm pitch, or 2-1000 μm and 20-2000 μm pitch were formed on the PR to be used as a substrate. ϕ represents the diameter of the exposed base area of a circular opening viewed from the direction perpendicular to the substrate, and represents the length of the side of the exposed base area of a rectangular opening viewed from the direction perpendicular to the substrate.

This substrate was subjected to pretreatment with 1.3 wt % tetramethylammonium hydroxide (TMAH) for 60 s, and with approximately 3 wt % of hydrochloric acid for 30 s, then processed with an electroless gold plating solution with a composition shown in Tables 1-6 (hereinafter, referred to as "pretreatment A").

As a planar plate for reference, a rolled Au plate (purity: 99.99%) with 0.1 mm thickness and 20 mm by 20 mm in size was used.

This planar plate was subjected to a pretreatment with electrolytic degreasing (EEJA eTrex 12) at 60° C., 5 V and 40 A·s, and with 10% sulfuric acid at room temperature for 30 s, then the plate was immersed in a plating solution simultaneously with the above substrate (hereinafter, referred to as "pretreatment B").

After the immersion test, height of the formed structure was measured using a surface-observation microscope VF-7500 manufactured by Keyence after the PR on the substrate was dissolved; external appearance was observed visually and by the above microscope and/or FE-SEM, and the deposition state on the substrate and the deposition state on the planar plate were compared and evaluated.

Example 1

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 1. After plating processing, the resist was removed and height of the structure was measured. The height of the structure and its fluctuation range are shown in Table 1.

The structure formed on the substrate was sufficiently higher than the thickness of the Au-deposition film on the planar plate, confirming that this electroless gold plating solution has the action of fine-area deposition acceleration.

Example 2

On the PR of the 3-inch Si wafer/Ti 20 nm/Au 100 nm/PR 10 μm, a plurality of openings with 10-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 1. After plating processing, the resist was removed and height of the structure was measured. The height of the structure and its fluctuation range are shown in Table 1.

The structure formed on the substrate was sufficiently higher than the thickness of the Au-deposition film on the planar plate, confirming that this electroless gold plating solution has the action of fine-area deposition acceleration.

Example 3

On the PR of the 3-inch Si wafer/Ti 20 nm/Au 100 nm/PR 10 μm, a plurality of openings with 5-μm φ and 20-μm pitch and a plurality of openings with 10-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 1. After plating processing, the resist was removed and height of the structure was measured. The height of the structure and its fluctuation range are shown in Table 1.

The structure formed on the substrate was sufficiently higher than the thickness of the Au-deposition film on the planar plate, confirming that this electroless gold plating solution has the action of fine-area deposition acceleration.

Examples 4-6

On the PR of the 3-inch Si wafer/Ti 20 nm/Au 100 nm/PR 10 μm, a plurality of openings with 10-50-μm and 20-100-μm pitch as shown in Table 1 were formed to make a substrate, and pretreatment A was carried out. For the reference planar plate, pretreatment B was carried out. The substrates and planar plates after these pretreatments were processed with the electroless gold plating solution and conditions shown in Table 1. After plating processing, the resist was removed and height of the structure was measured. The height of the structure and its fluctuation range are shown in Table 1.

The structure formed on the substrate was sufficiently higher than the thickness of the Au-deposition film on the planar plate, confirming that this electroless gold plating solution has the action of fine-area deposition acceleration.

Example 7

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 2. After plating processing, the resist was removed and height of the structure was measured. The height of the structure and its fluctuation range are shown in Table 2.

The structure formed on the substrate was sufficiently higher than the thickness of the Au-deposition film on the planar plate, confirming that this electroless gold plating solution has the action of fine-area deposition acceleration.

Examples 8-10

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 2. After plating processing, the resist was removed and height of the structure was measured. The height of the structure and its fluctuation range are shown in Table 2.

The structure formed on the substrate was sufficiently higher than the thickness of the Au-deposition film on the planar plate, confirming that this electroless gold plating solution has the action of fine-area deposition acceleration.

Example 11

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 2. After plating processing, the resist was removed and height of the structure was measured. The height of the structure and its fluctuation range are shown in Table 2.

The structure formed on the substrate was sufficiently higher than the thickness of the Au-deposition film on the planar plate, confirming that this electroless gold plating solution has the action of fine-area deposition acceleration.

Example 12

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 2. After plating processing, the resist was removed and height of the structure was measured. The height of the structure and its fluctuation range are shown in Table 2.

The structure formed on the substrate was sufficiently higher than the thickness of the Au-deposition film on the planar plate, confirming that this electroless gold plating solution has the action of fine-area deposition acceleration.

Examples 13-19

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 3. After plating processing, the resist was removed and height of the structure was measured. The height of the structure and its fluctuation range are shown in Table 3.

The structure formed on the substrate was sufficiently higher than the thickness of the Au-deposition film on the planar plate, confirming that this electroless gold plating solution has the action of fine-area deposition acceleration.

Examples 20-22

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution and conditions shown in Table 4. After plating processing, the resist was removed and height of the structure was measured. The height of the structure and its fluctuation range are shown in Table 4.

The structure formed on the substrate was sufficiently higher than the thickness of the Au-deposition film on the planar plate, confirming that this electroless gold plating solution has the action of fine-area deposition acceleration.

Examples 23-24

On the PR of the 3-inch Si wafer/Ti 20 nm/Au 100 nm/PR 10 μm, a plurality of openings with 10-20-μm and 20-50-μm pitch as shown in Table 4 were formed to make a substrate, and pretreatment A was carried out. For the reference planar plate, pretreatment B was carried out. The substrates and planar plates after these pretreatments were processed with the electroless gold plating solution and conditions shown in Table 4. After plating processing, the resist was removed and height of the structure was measured. The height of the structure and its fluctuation range are shown in Table 4.

The structure formed on the substrate was sufficiently higher than the thickness of the Au-deposition film on the planar plate, confirming that this electroless gold plating solution has the action of fine-area deposition acceleration.

Examples 25-30

On the PR of the 3-inch Si wafer/Ti 20 nm/Au 100 nm/PR 10 μm, a plurality of openings with 5-μm φ and 20-50-μm pitch were formed to make a substrate, and pretreatment A was carried out. For the reference planar plate, pretreatment B was carried out. The substrates and planar plates after these pretreatments were processed with the electroless gold plating solution and conditions shown in Table 5. After plating processing, the resist was removed and height of the structure was measured. The height of the structure and its fluctuation range are shown in Table 5.

The structure formed on the substrate was sufficiently higher than the thickness of the Au-deposition film on the planar plate, confirming that this electroless gold plating solution has the action of fine-area deposition acceleration.

Example 31

On the PR of the 3-inch wafer/Ti 10 nm/Cu vapor deposition 100 nm (wiring pattern)/Cu plating 500 nm/Ni electroless plating 500 nm/PR 10 μm, a plurality of openings with 10-μm φ and 30-μm pitch were formed. The layers from Ti to Ni are wiring patterns of a closed structure partially without lead line. Onto this substrate, an Au film with 50-80 nm thickness was formed on the Ni using non-cyanogen substitution Au plating to make a seed layer, then processed with the electroless gold plating solution shown in Table 5. After plating processing, the resist was removed to form a structure with 10-μm φ and mean height of 8 μm. Thus, fabrication of microfine patterns was possible even for a base laminated with multiple metal layers such as Ti, Cu, Ni, Au with closed patterns.

Comparative Example 1

On the PR of the 3-inch Si wafer/Ti 20 nm/Au 100 nm/PR 10 μm, a plurality of openings with 5-μm φ and 20-μm pitch and a plurality of openings with 10-μm φ and 20-μm pitch were formed to make a substrate, and pretreatment A was carried out. For the reference planar plate, pretreatment B was carried out. The substrates and planar plates after these pretreatments were processed with the electroless gold plating solution shown in Table 6. After plating processing, the resist was removed and height of the structure was measured. The height of the structure and its fluctuation range are shown in Table 6. The height of the structure formed on the substrate is almost similar to or only slightly larger than the thickness of the Au-deposition film on the planar plate; under the condition that fine-area deposition is not accelerated, namely using an electroless gold plating solution containing no accelerator for deposition in fine areas (adsorbent) and no deposition accelerator (anode reaction accelerator), only a structure with a low height could be obtained compared to the acceleration conditions shown in Examples.

Comparative Example 2

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution shown in Table 6. After plating processing, the resist was removed and height of the structure was measured. The height of the structure and its fluctuation range are shown in Table 6. Since thiourea used as the reducing agent also serves as an accelerator for deposition in fine areas, the height of the structure formed on the substrate becomes larger than the thickness of the Au deposition film on the planar plate, but it is not sufficiently high. Under the condition of not accelerating fine-area deposition, a structure with a height lower than that under the acceleration conditions shown in Examples was obtained.

Comparative Examples 3-4

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution shown in Table 6. After plating processing, the resist was removed and height of the structure was measured. The height of the structure and its fluctuation range are shown in Table 6. The thickness of the Au deposition film was low both on the planar plate and the openings. Although the accelerator for deposition in fine areas has an action to accelerate the deposition at fine areas as shown in Examples, since it suppresses the deposition when added in an excessive amount, its usable concentration range is limited.

Comparative Example 5

On the PR of the 3-inch Si wafer/Ti 20 nm/Au 100 nm/PR 10 μm, a plurality of openings with 5-μm φ and 20-μm pitch were formed to make a substrate, and pretreatment A was carried out. For the reference planar plate, pretreatment B was carried out. The substrates and planar plates after these pretreatments were processed with the electroless gold plating solution shown in Table 6. After plating processing, the resist was removed and height of the structure was measured. The height of the structure and its fluctuation range are shown in Table 6. The thickness of the Au deposition film does not differ largely between the planar plate and the openings. The reason for this is as follows: potassium iodide used as the accelerator accelerates, by its addition, the deposition at not only desired patterns, but also at outside of the patterns, resulting in frequent occurrence of deposition at outside of the patterns, and the nonlinear supply structure cannot be maintained. Thus, because addition of an accelerator may cause defects, its concentration range must be kept appropriately. However, this deposition at outside of patterns does not occur when an accelerator for deposition in fine areas is concomitantly used; therefore, as in Examples, deposition only at fine areas can be appropriately accelerated.

Comparative Example 6

On the PR of the 3-inch Si wafer/Ti 20 nm/Au 100 nm/PR 10 μm, a plurality of openings with 50-μm and 100-μm pitch were formed to make a substrate, and pretreatment A was carried out. For the reference planar plate, pretreatment B was carried out. The substrates and planar plates after these pretreatments were processed with the electroless gold plating solution shown in Table 6. After plating processing, the resist was removed and height of the structure was measured. The height of the structure and its fluctuation range are shown in Table 6. The thickness of the Au deposition film was low both on the planar plate and the openings. Although the accelerator for deposition in fine areas has an action to accelerate the deposition at openings as shown in Examples, since it suppresses the deposition when added in an excessive amount, its usable concentration range is limited. In addition, as in this comparative example, the effect differs depending on the size of openings; therefore, appropriate compound and concentration should be selected depending on the structure to be fabricated.

Comparative Example 7

On the PR of the 3-inch Si wafer/Ti 20 nm/Au 100 nm/PR 10 μm, a plurality of openings with 1-mm and 2-mm pitch were formed to make a substrate, and pretreatment A was carried out. For the reference planar plate, pretreatment B was carried out. The substrates and planar plates after these pretreatments were processed with the electroless gold plating solution shown in Table 6. After plating processing, the resist was removed and height of the structure was measured. The height of the structure and its fluctuation range are shown in Table 6. The thickness of the Au deposition film was almost the same at the planar plate and the openings. Thus, for large structures in a millimeter-order size, the fine-area deposition acceleration action is hardly exhibited.

Comparative Example 8

On the PR of the 3-inch Si wafer/Ti 20 nm/Au 100 nm/PR 10 μm, a plurality of openings with 5-μm φ and 20-μm pitch were formed to make a substrate, and pretreatment A was carried out. Using a cyanogen-free electrolytic gold plating solution shown in Table 6 (Osaka T. et al., J. Electrochem. Soc., 148 (10), C659-C662 (2001)), a current of 10 mA/cm$^2$ was applied for 16 min; as a result, the height of the structure was within 8 μm±2 μm, and the fluctuation range was larger than that in Examples in which electroless gold plating solutions were used.

TABLE 1

|  | Unit | Example | | | | | |
|---|---|---|---|---|---|---|---|
|  |  | 1 | 2 | 3 | 4 | 5 | 6 |
| Potassium sulfite | mol/L | 0.32 | 0.32 | 0.32 | 0.32 | 0.32 | 0.32 |
| Sodium thiosulfate pentahydrate | mol/L | 0.10 | 0.10 | 0.10 | 0.10 | 0.10 | 0.10 |
| Potassium dihydrogen phosphate | mol/L | 0.09 | 0.09 | 0.09 | 0.09 | 0.09 | 0.09 |
| Sodium gold sulfite solution | mol/L | 0.02 | 0.02 | 0.02 | 0.02 | 0.02 | 0.02 |
| Sodium L-ascorbate | mol/L | 0.10 | 0.10 | 0.10 | 0.10 | 0.10 | 0.10 |
| Thiourea | mol/L | — | — | — | — | — | — |
| Hydroquinone | mol/L | — | — | — | — | — | — |

TABLE 1-continued

|  | Unit | Example 1 | Example 2 | Example 3 | Example 4 | Example 5 | Example 6 |
|---|---|---|---|---|---|---|---|
| Benzotriazole | mg/L | 500 | 500 | 500 | 500 | 500 | 500 |
| Potassium iodide | mol/L | 0.15 | 0.15 | 0.15 | 0.15 | 0.15 | 0.15 |
| Sodium chloride | mol/L | 0.08 | 0.08 | — | — | — | — |
| Disodium dihydrogen ethylenediaminetetraacetate dihydrate | mg/L | 127 | 127 | 127 | 127 | 127 | 127 |
| 2-mercaptobenzothiazole | mg/L | 1.0 | 1.0 | 1.0 | 1.0 | 1.0 | 1.0 |
| Polyethylene glycol 20000 | mg/L | 1.0 | 1.0 | — | — | — | — |
| Polyethylene glycol 1540 | mg/L | — | — | — | — | — | — |
| Polyethylene glycol 2000 | mg/L | — | — | — | — | — | — |
| Polyethylene glycol 4000 | mg/L | — | — | — | — | — | — |
| Polyethylene glycol 6000 | mg/L | — | — | — | — | — | — |
| Polyethylene glycol #500 | mg/L | — | — | — | — | — | — |
| Polyvinyl pyrrolidone K = 30 | mg/L | — | — | — | — | — | — |
| 1,10-phenanthrolinium chloride | mg/L | — | — | — | — | — | — |
| pH |  | 7.2 | 7.2 | 7.2 | 7.2 | 7.2 | 7.2 |
| Temperature | °C. | 50 | 50 | 50 | 50 | 50 | 50 |
| Time | min. | 90 | 120 | 90 | 90 | 90 | 90 |
| Thickness of Au deposition film on the plate after test | μm | 1.1 | 1.9 | 1.8 | 2.0 | 2.3 | 1.9 |
| Shape of exposed base area in openings | μm | φ5 | φ10 | φ5, 10 | 10 | 20 | 50 |
| Height of microfine structure after test | μm | 9.2 | 5 | 4.4, 3.5 | 2.8 | 2.7 | 2.9 |
| Fluctuation range of height (= maximum-minimum value) | μm | <1 | <1 | <1 | <1 | <1 | <1 |

TABLE 2

|  | Unit | Example 7 | Example 8 | Example 9 | Example 10 | Example 11 | Example 12 |
|---|---|---|---|---|---|---|---|
| Potassium sulfite | mol/L | 0.32 | 0.32 | 0.16 | 0.64 | 0.32 | 0.32 |
| Sodium thiosulfate pentahydrate | mol/L | 0.10 | 0.05 | 0.10 | 0.10 | 0.10 | 0.10 |
| Potassium dihydrogen phosphate | mol/L | 0.09 | 0.09 | 0.09 | 0.09 | 0.09 | 0.09 |
| Sodium gold sulfite solution | mol/L | 0.02 | 0.02 | 0.02 | 0.02 | 0.01 | 0.02 |
| Sodium L-ascorbate | mol/L | 0.10 | 0.10 | 0.10 | 0.10 | 0.10 | — |
| Thiourea | mol/L | — | — | — | — | — | 0.039 |
| Hydroquinone | mol/L | — | — | — | — | — | 0.027 |
| Benzotriazole | mg/L | 500 | 500 | 500 | 500 | 500 | 500 |
| Potassium iodide | mol/L | 0.15 | 0.15 | 0.15 | 0.15 | 0.15 | 0.15 |
| Sodium chloride | mol/L | — | — | — | — | — | — |
| Disodium dihydrogen ethylenediaminetetraacetate dihydrate | mg/L | 127 | 127 | 127 | 127 | 127 | 127 |
| 2-mercaptobenzothiazole | mg/L | 1 | 1 | 1 | 1 | 1 | 1 |
| Polyethylene glycol 20000 | mg/L | — | — | — | — | — | — |
| Polyethylene glycol 1540 | mg/L | — | — | — | — | — | — |
| Polyethylene glycol 2000 | mg/L | — | — | — | — | — | — |
| Polyethylene glycol 4000 | mg/L | — | — | — | — | — | — |
| Polyethylene glycol 6000 | mg/L | — | — | — | — | — | — |
| Polyethylene glycol #500 | mg/L | — | — | — | — | — | — |
| Polyvinyl pyrrolidone K = 30 | mg/L | — | — | — | — | — | — |
| 1,10-phenanthrolinium chloride | mg/L | — | — | — | — | — | — |
| pH |  | 7.2 | 7.2 | 7.2 | 7.2 | 7.2 | 7.2 |
| Temperature | °C. | 40 | 50 | 50 | 50 | 50 | 50 |
| Time | min. | 90 | 90 | 90 | 90 | 120 | 90 |
| Thickness of Au deposition film on the plate after test | μm | 1.1 | 1.7 | 2.9 | 1.2 | 1.3 | 0.32 |
| Shape of exposed base area in openings | μm | φ5 | φ5 | φ5 | φ5 | φ5 | φ5 |
| Height of microfine structure after test | μm | 3.0 | 4.2 | 4.8 | 3.3 | 3.6 | 5.0 |
| Fluctuation range of height (= maximum-minimum value) | μm | <1 | <1 | <1 | <1 | <1 | <1 |

TABLE 3

| | Unit | \multicolumn{7}{c}{Example} |
|---|---|---|---|---|---|---|---|---|
| | | 13 | 14 | 15 | 16 | 17 | 18 | 19 |
| Potassium sulfite | mol/L | 0.32 | 0.32 | 0.32 | 0.32 | 0.32 | 0.32 | 0.32 |
| Sodium thiosulfate pentahydrate | mol/L | 0.10 | 0.10 | 0.10 | 0.10 | 0.10 | 0.10 | 0.10 |
| Potassium dihydrogen phosphate | mol/L | 0.09 | 0.09 | 0.09 | 0.09 | 0.09 | 0.09 | 0.09 |
| Sodium gold sulfite solution | mol/L | 0.02 | 0.02 | 0.02 | 0.02 | 0.02 | 0.02 | 0.02 |
| Sodium L-ascorbate | mol/L | 0.10 | 0.10 | 0.10 | 0.10 | 0.10 | 0.10 | 0.10 |
| Thiourea | mol/L | — | — | — | — | — | — | — |
| Hydroquinone | mol/L | — | — | — | — | — | — | — |
| Benzotriazole | mg/L | — | — | — | — | — | — | — |
| Potassium iodide | mol/L | — | — | — | — | — | — | — |
| Sodium chloride | mol/L | — | — | — | — | — | — | — |
| Disodium dihydrogen ethylenediaminetetraacetate dihydrate | mg/L | — | — | — | — | — | — | — |
| 2-mercaptobenzothiazole | mg/L | — | — | — | — | — | — | — |
| Polyethylene glycol 20000 | mg/L | 3.0 | 3.0 | — | — | — | — | — |
| Polyethylene glycol 1540 | mg/L | — | — | 1.0 | — | — | — | — |
| Polyethylene glycol 2000 | mg/L | — | — | — | — | — | — | — |
| Polyethylene glycol 4000 | mg/L | — | — | — | 1.0 | — | — | — |
| Polyethylene glycol 6000 | mg/L | — | — | — | — | — | — | 10.0 |
| Polyethylene glycol #500 | mg/L | — | — | — | — | 1.0 | — | — |
| Polyvinyl pyrrolidone K = 30 | mg/L | — | — | — | — | — | 1.0 | — |
| 1,10-phenanthrolinium chloride | mg/L | — | — | — | — | — | 2.0 | — |
| pH | | 7.2 | 7.2 | 7.2 | 7.2 | 7.2 | 7.2 | 7.2 |
| Temperature | °C. | 50 | 50 | 50 | 50 | 50 | 50 | 50 |
| Time | min. | 120 | 90 | 90 | 90 | 90 | 90 | 90 |
| Thickness of Au deposition film on the plate after test | μm | 0.4 | 0.01 | 0.03 | 0.07 | 0.03 | 0.25 | 0 |
| Shape of exposed base area in openings | μm | φ5 | φ5 | φ5 | φ5 | φ5 | φ5 | φ5 |
| Height of microfine structure after test | μm | 3.3 | 5.5 | 6.5 | 5.3 | 5.1 | 4.1 | 6.1 |
| Fluctuation range of height (= maximum-minimum value) | μm | <1 | <1 | <1 | <1 | <1 | <1 | <1 |

TABLE 4

| | Unit | \multicolumn{5}{c}{Example} |
|---|---|---|---|---|---|---|
| | | 20 | 21 | 22 | 23 | 24 |
| Potassium sulfite | mol/L | 0.32 | 0.32 | 0.32 | 0.32 | 0.32 |
| Sodium thiosulfate pentahydrate | mol/L | 0.10 | 0.10 | 0.10 | 0.10 | 0.10 |
| Potassium dihydrogen phosphate | mol/L | 0.09 | 0.09 | 0.09 | 0.09 | 0.09 |
| Sodium gold sulfite solution | mol/L | 0.02 | 0.02 | 0.02 | 0.02 | 0.02 |
| Sodium L-ascorbate | mol/L | 0.10 | 0.10 | 0.10 | 0.10 | 0.10 |
| Thiourea | mol/L | — | — | — | — | — |
| Hydroquinone | mol/L | — | — | — | — | — |
| Benzotriazole | mg/L | — | — | — | — | — |
| Potassium iodide | mol/L | 0.15 | 0.15 | 0.15 | 0.15 | 0.15 |
| Sodium chloride | mol/L | — | — | — | — | — |
| Disodium dihydrogen ethylenediaminetetraacetate dihydrate | mg/L | — | — | — | — | — |
| 2-mercaptobenzothiazole | mg/L | — | — | — | — | — |
| Polyethylene glycol 20000 | mg/L | — | 10.0 | — | — | — |
| Polyethylene glycol 1540 | mg/L | — | — | — | — | — |
| Polyethylene glycol 2000 | mg/L | — | — | — | — | — |
| Polyethylene glycol 4000 | mg/L | — | — | — | — | — |
| Polyethylene glycol 6000 | mg/L | — | — | 10.0 | 10.0 | 10.0 |
| Polyethylene glycol #500 | mg/L | — | — | — | — | — |
| Polyvinyl pyrrolidone K = 30 | mg/L | — | — | — | — | — |
| 1,10-phenanthrolinium chloride | mg/L | 20.0 | — | — | — | — |
| pH | | 7.2 | 7.2 | 7.2 | 7.2 | 7.2 |
| Temperature | °C. | 50 | 50 | 50 | 50 | 50 |
| Time | min. | 90 | 90 | 90 | 90 | 90 |
| Thickness of Au deposition film on the plate after test | μm | 0 | 0 | 0 | 0 | 0 |
| Shape of exposed base area in openings | μm | φ5 | φ5 | φ5 | 10 | 20 |
| Height of microfine structure after test | μm | 6.5 | 9 | 9 | 5.9 | 5.3 |
| Fluctuation range of height (= maximum-minimum value) | μm | <1 | <1 | <1 | <1 | <1 |

TABLE 5

| | Unit | \multicolumn{7}{c}{Example} |
|---|---|---|---|---|---|---|---|---|
| | | 25 | 26 | 27 | 28 | 29 | 30 | 31 |
| Potassium sulfite | mol/L | 0.32 | 0.32 | 0.32 | 0.32 | 0.32 | 0.32 | 0.32 |
| Sodium thiosulfate pentahydrate | mol/L | 0.10 | 0.10 | 0.10 | 0.10 | 0.10 | 0.10 | 0.10 |
| Potassium dihydrogen phosphate | mol/L | 0.09 | 0.09 | 0.09 | 0.09 | 0.09 | 0.09 | 0.09 |
| Sodium gold sulfite solution | mol/L | 0.02 | 0.02 | 0.02 | 0.02 | 0.02 | 0.02 | 0.02 |
| Sodium L-ascorbate | mol/L | 0.10 | 0.10 | 0.10 | 0.10 | 0.10 | 0.10 | 0.10 |
| Thiourea | mol/L | — | — | — | — | — | — | — |
| Hydroquinone | mol/L | — | — | — | — | — | — | — |
| Benzotriazole | mg/L | — | — | — | — | — | — | 500 |

TABLE 5-continued

|  | Unit | Example 25 | Example 26 | Example 27 | Example 28 | Example 29 | Example 30 | Example 31 |
|---|---|---|---|---|---|---|---|---|
| Potassium iodide | mol/L | 0.04 | 0.05 | 0.08 | 0.10 | 0.15 | 0.30 | 0.15 |
| Sodium chloride | mol/L | — | — | — | — | — | — | — |
| Disodium dihydrogen ethylenediaminetetraacetate dihydrate | mg/L | — | — | — | — | — | — | 127 |
| 2-mercaptobenzothiazole | mg/L | — | — | — | — | — | — | 1.0 |
| Polyethylene glycol 20000 | mg/L | 10.0 | 10.0 | 10.0 | 10.0 | 10.0 | 10.0 | — |
| Polyethylene glycol 1540 | mg/L | — | — | — | — | — | — | — |
| Polyethylene glycol 2000 | mg/L | — | — | — | — | — | — | — |
| Polyethylene glycol 4000 | mg/L | — | — | — | — | — | — | — |
| Polyethylene glycol 6000 | mg/L | — | — | — | — | — | — | — |
| Polyethylene glycol #500 | mg/L | — | — | — | — | — | — | — |
| Polyvinyl pyrrolidone K = 30 | mg/L | — | — | — | — | — | — | — |
| 1,10-phenanthrolinium chloride | mg/L | — | — | — | — | — | — | — |
| pH |  | 7.2 | 7.2 | 7.2 | 7.2 | 7.2 | 7.2 | 7.2 |
| Temperature | °C. | 50 | 50 | 50 | 50 | 50 | 50 | 50 |
| Time | min. | 45 | 45 | 45 | 45 | 45 | 45 | 120 |
| Thickness of Au deposition film on the plate after test | μm | 0 | 0 | 0 | 0 | 0 | 0 | 2.5 |
| Shape of exposed base area in openings | μm | φ5 | φ5 | φ5 | φ5 | φ5 | φ5 | φ10 |
| Height of microfine structure after test | μm | 3.9 | 6.3 | 6.0 | 5.5 | 4.6 | 4.5 | 8 |
| Fluctuation range of height (= maximum-minimum value) | μm | <1 | <1 | <1 | <1 | <1 | <1 | <1 |

TABLE 6

|  | Unit | Comparative Example 1 | 2 | 3 | 4 | 5 | 6 | 7 | 8 |
|---|---|---|---|---|---|---|---|---|---|
| Potassium sulfite | mol/L | 0.32 | 0.32 | 0.32 | 0.32 | 0.32 | 0.32 | 0.32 | 0.42 |
| Sodium thiosulfate pentahydrate | mol/L | 0.10 | 0.10 | 0.10 | 0.10 | 0.10 | 0.10 | 0.10 | 0.84 |
| Potassium dihydrogen phosphate | mol/L | 0.09 | 0.09 | 0.09 | 0.09 | 0.09 | 0.09 | 0.09 | 0.30 |
| Sodium gold sulfite solution | mol/L | 0.02 | 0.02 | 0.02 | 0.02 | 0.02 | 0.02 | 0.02 | 0.06 |
| Sodium L-ascorbate | mol/L | 0.10 | — | 0.10 | 0.10 | 0.10 | 0.10 | 0.10 | — |
| Thiourea | mol/L | — | 0.020 | — | — | — | — | — | — |
| Hydroquinone | mol/L | — | 0.014 | — | — | — | — | — | — |
| Benzotriazole | mg/L | — | — | 500 | — | — | — | 500 | — |
| Potassium iodide | mol/L | — | — | 0.10 | — | 0.15 | 0.15 | 0.15 | — |
| Sodium chloride | mol/L | — | — | — | — | — | — | — | — |
| 2-mercaptobenzothiazole | mg/L | — | — | 5.0 | — | — | — | 1.0 | — |
| Disodium dihydrogen ethylenediaminetetraacetate dihydrate | mg/L | — | — | — | — | — | — | 127 | — |
| Polyethylene glycol 6000 | mg/L | — | — | — | — | — | 10.0 | — | — |
| Polyethylene glycol 1540 | mg/L | — | — | — | 3.0 | — | — | — | — |
| Polyethylene glycol #500 | mg/L | — | — | — | — | — | — | — | — |
| Polyvinyl pyrrolidone K = 30 | mg/L | — | — | — | — | — | — | — | — |
| pH |  | 7.2 | 7.2 | 7.2 | 7.2 | 7.2 | 7.2 | 7.2 | 6.0 |
| Temperature | °C. | 50 | 50 | 50 | 50 | 50 | 50 | 50 | 60 |
| Time | min. | 90 | 90 | 90 | 90 | 45 | 90 | 90 | 16 |
| Thickness of Au deposition film on the plate after test | μm | 1.6 | 0.3 | 0.5 | 0.03 | 1.2 | 0.0 | 2.1 |  |
| Shape of exposed base area in openings | μm | φ5, 10 | φ5 | φ5 | φ5 | φ5 | 50 | 1000 | φ5 |
| Height of microfine structure after test | μm | 1.7-2.8, 1.6 | 1.4 | 0 | 0.3 | 1.4 | 0 | 2.1 | 8.4 |
| Fluctuation range of height (= maximum-minimum value) | μm | <1 | <1 | — | — | — | — | <1 | 2 |

The electroless gold plating solution of the present invention is able to, by comprising an accelerator for deposition in fine areas, uniformly fill one or more openings with a size of micrometer order, in particular those having a width of the exposed base area of 100 μm or less and a height of 3 μm or more, which are formed on a resist coating on a substrate; as a result, a microfine pattern with a uniform height can be formed in a short period of time.

The invention claimed is:
1. A method for forming a microfine pattern, comprising forming one or more openings having a width of the exposed base area of 100 μm or less in a resist coating on a substrate, and immersing the resist-coated, opening-formed substrate in an electroless gold plating solution-comprising an accelerator for deposition in fine areas with a width of 100 μm or less comprising one or more compounds selected from the group consisting of polyvinyl alcohol, polyvinyl pyrrolidone, benzotriazole and 1,10-phenanthrolinium, and a gold source, thereby filling the openings with gold.

2. The method according to claim 1, wherein the opening is an opening for forming the microfine pattern containing bumps and wiring patterns.

3. The method according to claim 1, wherein the microfine pattern with a height of 3 μm or more is formed within 120 minutes of immersing the resist-coated, opening-formed substrate in the electroless gold plating solution.

4. The method according to claim 1, wherein the microfine pattern is formed on a base that is a substrate whose entire surface is uniformly coated with a metal film and/or on a closed pattern without lead line.

5. The method according to claim 4, wherein the metal film is a film of single layer or multiple layers formed from one or more of gold, nickel, copper, silver, aluminum, palladium, cobalt, titanium, tantalum, and tungsten, or from an alloy comprising them.

6. The method according to claim 1, wherein the resist coating on the substrate is a positive type or a negative type.

7. The method according to claim 1, wherein the temperature during electroless gold plating is 20-60° C.

8. The method according to claim 1, wherein the electroless gold plating solution has pH 6-8.

9. The method according to claim 1, wherein the concentration of the accelerator for deposition in fine areas is 0.001-10,000 mg/L.

10. The method according to claim 1, wherein the electroless gold plating solution further comprises a gold-deposition accelerator, which is a compound that generates halogen ions in an aqueous solution.

11. The method according to claim 10, wherein the concentration of the gold-deposition accelerator is 0.001-3.0 mol/L.

12. The method according to claim 1, wherein the electroless gold plating solution further comprises a gold-deposition acceleration adjuvant, a complexing agent, a pH buffering agent, a pH adjuster, a reducing agent, and/or an additive.

13. The method according to claim 1, wherein the electroless gold plating solution does not comprise a cyanide compound.

* * * * *